United States Patent
Lim et al.

(10) Patent No.: US 7,338,894 B2
(45) Date of Patent: *Mar. 4, 2008

(54) SEMICONDUCTOR DEVICE HAVING NITRIDATED OXIDE LAYER AND METHOD THEREFOR

(75) Inventors: Sangwoo Lim, Austin, TX (US); Robert F. Steimle, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 159 days.

This patent is subject to a terminal disclaimer.

(21) Appl. No.: 11/043,827

(22) Filed: Jan. 26, 2005

(65) Prior Publication Data

US 2006/0166493 A1    Jul. 27, 2006

(51) Int. Cl.
*H01L 21/4763* (2006.01)
*H01L 21/31* (2006.01)
*H01L 21/469* (2006.01)
*H01L 21/331* (2006.01)
*H01L 21/8238* (2006.01)

(52) U.S. Cl. ............ 438/637; 438/369; 438/775; 438/200

(58) Field of Classification Search ........... 438/369, 438/637, 775, 257, 478, 211, 503
See application file for complete search history.

(56) References Cited

U.S. PATENT DOCUMENTS

| 6,297,095 | B1 | 10/2001 | Muralidhar |
| 6,320,784 | B1 | 11/2001 | Muralidhar |
| 6,413,819 | B1 | 7/2002 | Zafar |
| 6,444,545 | B1 | 9/2002 | Sadd |
| 6,713,127 | B2 | 3/2004 | Subramony |
| 2006/0110883 | A1* | 5/2006 | Min .................... 438/260 |
| 2006/0166452 | A1* | 7/2006 | Rao et al. ............ 438/369 |

OTHER PUBLICATIONS

Lai, "Tunnel Oxide and ETOX™ Flash Scaling Limitation," IEEE 1998 Int'l Nonvolatile Memory Technology Conference, pp. 6-7.
Cavins et al., "A Nitride-Oxide Blocking Layer for Scaled SONOS Non-Volatile Memory," *Motorola, Inc.*, Jan. 10, 2002, 3 pages.

* cited by examiner

*Primary Examiner*—Chuong Anh Luu
(74) *Attorney, Agent, or Firm*—Daniel D. Hill; James L. Clingan, Jr.

(57) ABSTRACT

A semiconductor device includes a substrate (12), a first insulating layer (14) over a surface of the substrate (12), a layer of nanocrystals (13) over a surface of the first insulating layer (14), a second insulating layer (15) over the layer of nanocrystals (13). A nitriding ambient is applied to the second insulating layer (15) to form a barrier to further oxidation when a third insulating layer (22) is formed over the substrate (12). The nitridation of the second insulating layer (15) prevents oxidation or shrinkage of the nanocrystals and an increase in the thickness of the first insulating layer 14 without adding complexity to the process flow for manufacturing the semiconductor device (10).

12 Claims, 3 Drawing Sheets

US 7,338,894 B2

SEMICONDUCTOR DEVICE HAVING NITRIDATED OXIDE LAYER AND METHOD THEREFOR

RELATED APPLICATIONS

A related, copending application is entitled "Non-volatile Nanocrystal Memory and Method Therefor", by Rao et al., Ser. No. 11/043,826, assigned to the assignee hereof, and filed concurrently herewith.

FIELD OF THE INVENTION

The present invention relates generally to semiconductor devices, and more particularly, to a semiconductor device having a nitridated oxide layer and method therefor.

BACKGROUND OF THE INVENTION

Many semiconductor non-volatile memory arrays require a relatively high voltage for programming and erasing operations. During manufacture of the non-volatile memory arrays, high voltage tolerant transistors that can withstand, for example, the relatively high programming and erase voltages are implemented at the same time as the array. In a non-volatile memory array that relies on nanocrystals for charge storage, the charge storage layer is formed prior to the formation of the high voltage transistor gate oxide. The subsequent formation of oxide layers may cause further oxidation of the insulating layers. Further oxidation in the non-volatile device may lead to an increase in the tunnel oxide thickness. Also, further oxidation may cause the nanocrystals to oxidize and shrink. Changing the charge storage layer may lead to the need for higher program and erase voltages. Also, changing the charge storage layer may lead to an undesirable change in program and erase threshold voltages.

Therefore, there is a need for a non-volatile memory device having an accurately controlled charge storage region while also reducing the steps needed to manufacture the device.

DETAILED DESCRIPTION

Generally, the present invention provides, in one form, a method for forming a semiconductor device comprising: providing a semiconductor substrate; forming a first insulating layer over a surface of the semiconductor substrate; forming a layer of nanocrystals over a surface of the first insulating layer; forming a second insulating layer over the layer of nanocrystals; applying a nitriding ambient to the second insulating layer; selectively removing portions of the layer of nanocrystals and the first and second insulating layers to expose the surface of the semiconductor substrate; and forming a third insulating layer over the exposed surface of the semiconductor substrate.

In another form, the present invention provides a semiconductor device comprising: a semiconductor substrate; a first insulating layer formed over a surface of the semiconductor substrate; a patterned layer of nanocrystals formed over a surface of the first insulating layer; a second insulating layer formed over the layer of nanocrystals, the second insulating layer having a nitrogen content greater than or equal to two (2) atomic percent of the second insulating layer; and a third insulating layer formed on the surface of the semiconductor substrate and not over the first and second insulating layer.

By nitriding the second insulating layer, oxidation of the nanocrystals and the first insulating layer is reduced, thus reducing, or restricting, a change in oxide thickness when subsequent oxide layers are formed. Also, using nitridation instead of an oxidation barrier simplifies the manufacturing process.

Figure 1:
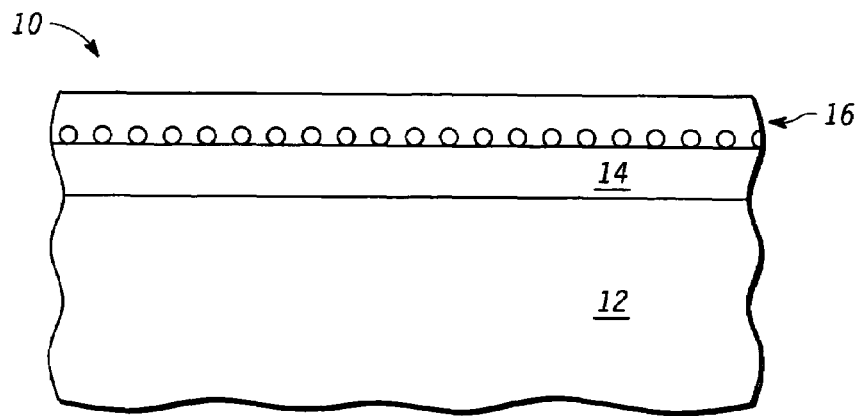
FIG. 1 illustrates a cross-sectional view of a portion of a semiconductor device having a tunnel oxide and charge storage layer in accordance with the present invention.

FIG. 1 illustrates a cross-sectional view of a portion of a semiconductor device 10 having a tunnel oxide 14 and charge storage stack 16 formed on a semiconductor substrate 12. The semiconductor substrate 12 may be formed from silicon. A first insulating layer 14 is formed over the substrate 12 which functions as the tunnel oxide for a non-volatile memory cell. The first insulating layer 14 may be silicon dioxide, nitrided oxide, or other high-k dielectric. The insulating layer 14 may be thermally grown or deposited, and the thickness may be on the order of 50 Angstroms. Charge storage stack 16 includes a plurality of discrete charge storage elements. In the illustrated embodiment, nanocrystals, represented by the small circles in charge storage layer 16, are used to form the plurality of discrete charge storage elements. These nanocrystals are typically formed of silicon, but the discrete storage elements may also be formed of clusters of material consisting of, for example, germanium, silicon carbide, any number of metals, or any combination of these. The nanocrystals are preferably deposited by chemical deposition, but other processes may also be used. Other processes for forming nanocrystals include recrystallization of a thin amorphous layer of silicon and the deposition of prefabricated nanocrystals. Subsequent to nanocrystal formation, the nanocrystals may be passivated by oxidizing them using nitrous oxide.

Figure 2:
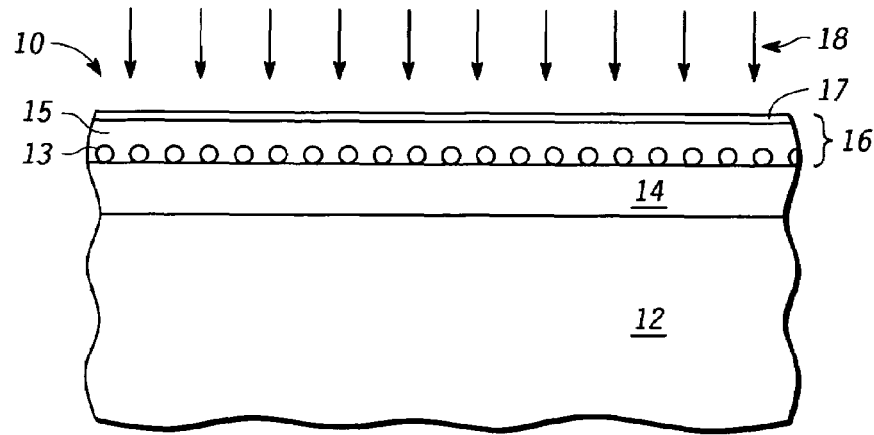
FIG. 2 illustrates a cross-sectional view of a portion of the semiconductor device exposed to a nitriding ambient in accordance with the present invention.

FIG. 2 illustrates a cross-sectional view of a portion of the semiconductor device 10 exposed to a nitriding ambient. The charge storage stack 16 includes the nanocrystals 13 surrounded by an oxide 15. Alternately, the charge storage stack 16 may formed by forming a plurality of relatively thin insulating layers, such as an insulating layer 17, over one another. After forming charge storage stack 16, the semiconductor device 10 is exposed to a nitriding ambient. The nitriding ambient includes one or more of ammonia, nitrous oxide, atomic nitrogen, or other nitrogen compounds. The process for exposing the semiconductor device 10 to the nitriding ambient may include one of plasma nitridation, thermal nitridation, or ion nitridation.

The semiconductor device 10 is placed in a processing chamber having one or more of a plasma source, a thermal source or an ion source. Appropriate chambers are commercially available. In the processing chamber, the semiconductor device is exposed to a plasma 18 to provide a nitrogen content of greater than or equal to 2 atomic percent and preferably between 2 and 10 atomic percent.

Figure 3:
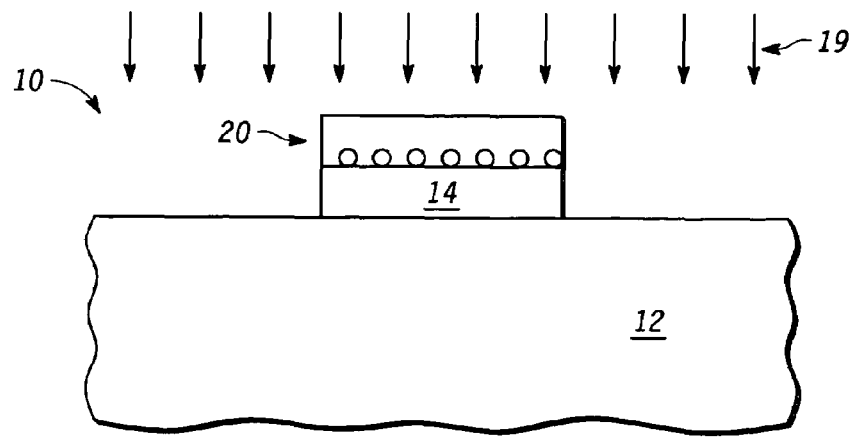
FIG. 3 illustrates a cross-sectional view of a portion of the semiconductor device after patterning of the charge storage region in accordance with the present invention.

FIG. 3 illustrates a cross-sectional view of a portion of the semiconductor device 10 after patterning of the charge storage region 16 and first insulating layer 14 to form a patterned charge storage layer 20. A photo resist layer (not shown) is deposited over the charge storage region 16 and then patterned. Optionally, in another embodiment, the step of nitridation using a nitrogen containing plasma 19 may be accomplished after patterning instead of before patterning using one or more of a plasma source, a thermal source or an ion source as described above.

Figure 4:
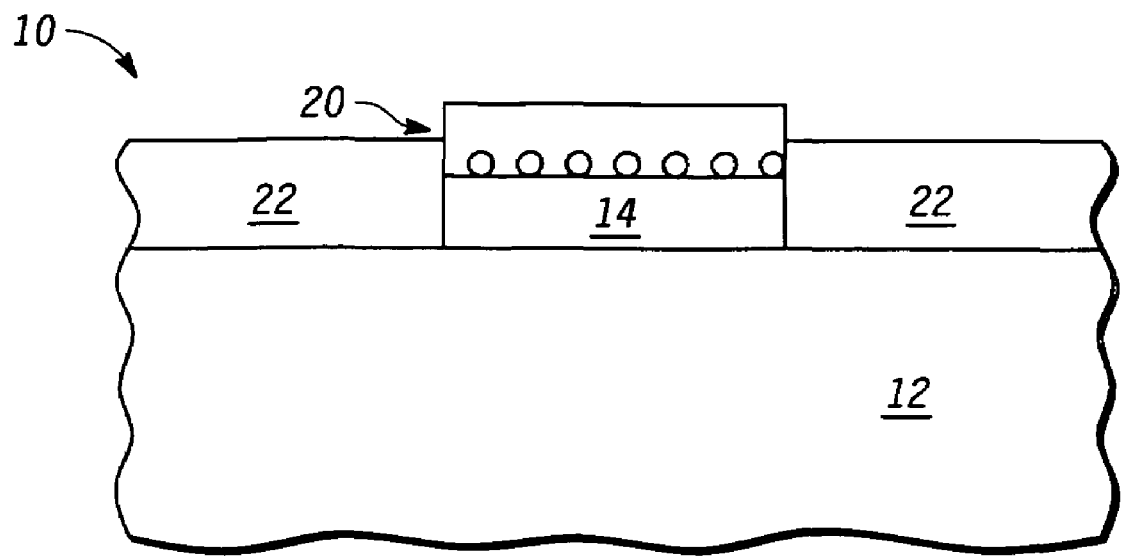
FIG. 4 illustrates a cross-sectional view of a portion of the semiconductor device after a gate dielectric is formed adjacent to the patterned charge storage region in accordance with the present invention.

FIG. 4 illustrates a cross-sectional view of a portion of the semiconductor device 10 after a gate dielectric 22 is formed adjacent to the patterned charge storage layer 20. The gate dielectric 22 may be one thickness throughout or may be different thicknesses to accommodate, for example, both high voltage transistors and logic circuits.

Figure 5:
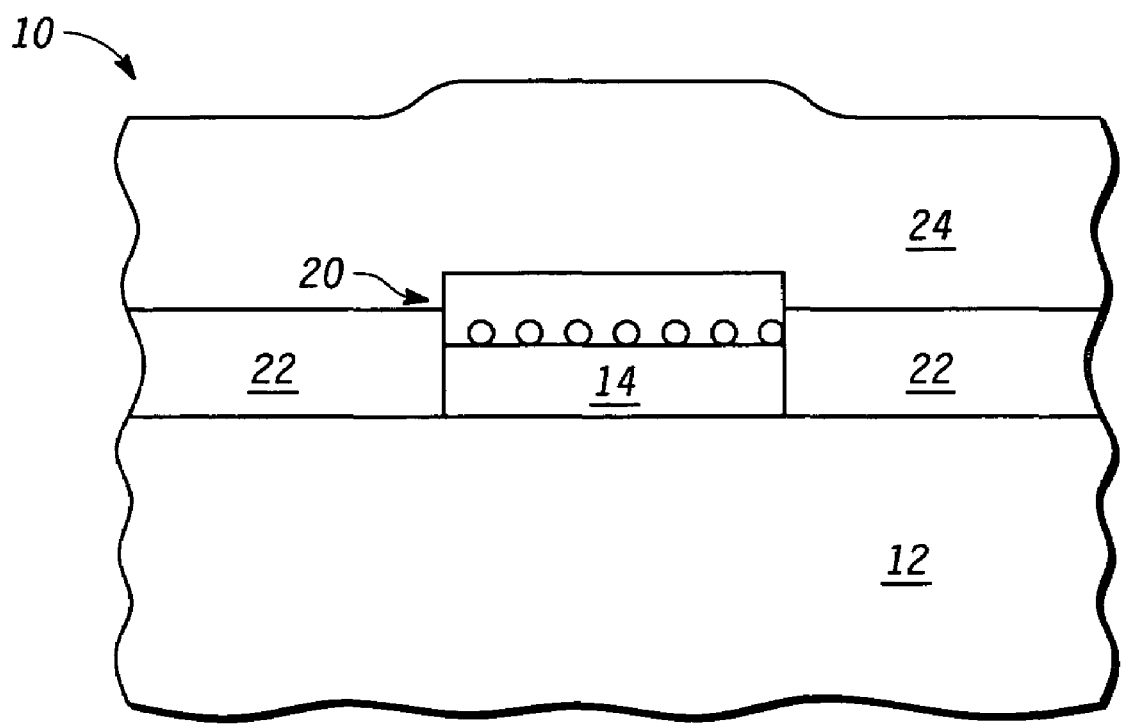
FIG. 5 illustrates a cross-sectional view of a portion of the semiconductor device after a polysilicon layer is formed in accordance with the present invention.

FIG. 5 illustrates a cross-sectional view of a portion of the semiconductor device 10 after a polysilicon layer 24 is formed over the patterned charge storage layer 20 and the gate dielectric 22.

Figure 6:
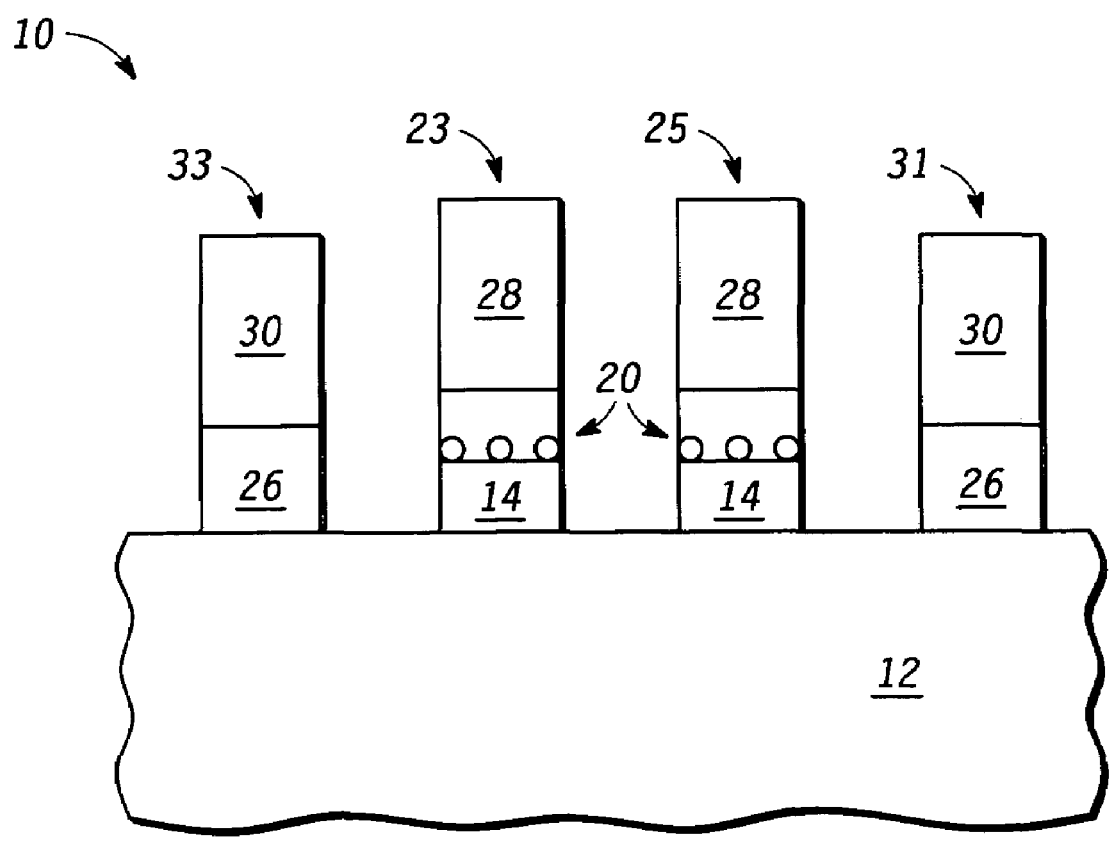
FIG. 6 illustrates a cross-sectional view of a portion of the semiconductor device after gates are formed in the polysilicon layer accordance with the present invention.

FIG. 6 illustrates a cross-sectional view of a portion of the semiconductor device 10 after the polysilicon layer 24 is patterned and etched to form gate electrodes. Non-volatile memory cells 23 and 25 are representative of an array of non-volatile memory cells implemented on an integrated circuit. The non-volatile memory cells may be on a "standalone memory device or embedded with other circuitry, such as a central processing unit. Non-volatile memory cells 23 and 25 are formed by selectively etching charge storage layer 20, first insulating layer 14, and polysilicon layer 24. The gate electrodes 28 are formed from the polysilicon layer 24.

Note that the memory array requires additional circuitry, whether on not the memory array is embedded, to access the memory array, such as row and column decoders and input/output (I/O) circuits. Some of these additional circuits may be exposed to the relatively high programming and erase voltages and will therefore require thicker gate oxides than the circuits not exposed to the higher programming and erase voltages. Transistors 31 and 33 in FIG. 6 represent transistors necessary to implement the additional circuits. The nitridation of the patterned charge storage layer 20 prevents oxidation or shrinkage of the nanocrystals in memory cells 23 and 25 and an increase in the thickness of the first insulating layer 14. The nitidated second insulating layer 20 incorporates an oxidation barrier and thus provides a relatively simple process flow for manufacturing the semiconductor device 10.

Not shown in FIG. 6 but usually included in the formation of transistors are sidewall spacers and source/drain regions. Typically, the side-wall spacers are formed by deposition of a layer of spacer material, followed by an anisotropic etch of the spacer material. The spacer material is typically nitride. The source/drain regions are typically diffused adjacent to the gate stack.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true scope of the invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device comprising:
   providing a semiconductor substrate;
   forming a first insulating layer over a surface of the semiconductor substrate;
   forming a layer of nanocrystals over a surface of the first insulating layer;
   forming a second insulating layer over the layer of nanocrystals;
   applying a nitriding ambient to the second insulating layer;
   selectively removing portions of the layer of nanocrystals and the first and second insulating layers to expose the surface of the semiconductor substrate; and
   forming a third insulating layer over the exposed surface of the semiconductor substrate.

2. The method of claim 1, further comprising forming a patterned polysilicon layer over the second insulating layer, wherein the patterned polysilicon layer forms gate electrodes for a plurality of non-volatile memory cells.

3. The method of claim 2, wherein the patterned polysilicon layer is formed over the third insulating layer to form gate electrodes for a plurality of transistors.

4. The method of claim 1, wherein applying the nitriding ambient to the second insulating layer comprises applying the nitriding ambient using plasma nitridation.

5. The method of claim 1, wherein applying the nitriding ambient to the second insulating layer comprises applying the nitriding ambient using thermal nitridation.

6. The method of claim 1, wherein applying nitrogen to the second insulating layer comprises applying the nitriding ambient using ion implantation.

7. The method of claim 1, further comprising:
   forming a fourth insulating layer over the second insulating layer; and applying a second nitriding ambient to the fourth insulating layer.

8. The method of claim 1, wherein forming the second insulating layer comprises forming the second insulating layer by forming a laminate of insulating layers.

9. The method of claim 8, wherein applying the nitriding ambient to the second insulating layer comprises applying the nitriding ambient to each layer of the laminate of insulating layers after each layer of the laminate of insulating layers is formed.

10. The method of claim 1, further comprising annealing the semiconductor device after applying the nitriding ambient to the second insulating layer.

11. The method of claim 1, wherein the nitriding ambient is applied to the second insulating layer after the portions of the layer of nanocrystals are selectively removed.

12. The method of claim 1, wherein the nitriding ambient includes one or more of ammonia, nitrous oxide, atomic nitrogen, or other nitrogen compounds.

* * * * *